US009691479B1

(12) United States Patent
Merced Grafals et al.

(10) Patent No.: US 9,691,479 B1
(45) Date of Patent: Jun. 27, 2017

(54) METHOD OF OPERATING AND APPARATUS OF MEMRISTOR ARRAYS WITH DIAGONAL LINES INTERCONNECT BETWEEN MEMRISTOR CELLS

(71) Applicant: Hewlett Packard Enterprise Development LP, Houston, TX (US)

(72) Inventors: Emmanuelle J. Merced Grafals, Palo Alto, CA (US); Brent Buchanan, Palo Alto, CA (US); Le Zheng, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/142,995

(22) Filed: Apr. 29, 2016

(51) Int. Cl.
  *G11C 11/00* (2006.01)
  *G11C 13/00* (2006.01)

(52) U.S. Cl.
  CPC ........ *G11C 13/0069* (2013.01); *G11C 13/004* (2013.01); *G11C 13/0026* (2013.01); *G11C 13/0097* (2013.01); *G11C 13/0002* (2013.01); *G11C 2213/71* (2013.01)

(58) Field of Classification Search
  CPC .............. G11C 13/0069; G11C 13/004; G11C 13/0002; G11C 13/0004; G11C 2213/71; H01L 27/1112
  USPC .................................. 365/148, 51, 100, 158
  See application file for complete search history.

(56) References Cited

U.S. PATENT DOCUMENTS

| | | | |
|---|---|---|---|
| 6,606,263 B1 | 8/2003 | Tang | |
| 7,622,779 B2 | 11/2009 | Cheng et al. | |
| 7,929,345 B2 | 4/2011 | Issaq | |
| 8,174,874 B2* | 5/2012 | Inaba | G11C 7/18 365/148 |
| 8,179,739 B2 | 5/2012 | Hanzawa et al. | |
| 9,312,002 B2* | 4/2016 | Navon | G11C 13/0069 |
| 9,455,301 B2* | 9/2016 | Ratnam | G11C 13/004 |
| 2015/0340091 A1 | 11/2015 | Zhu et al. | |

OTHER PUBLICATIONS

Chabi, D. et al.; "On-Chip Supervised Learning Rule for Ultra High Density Neural Crossbar Using Memristor for Synapse and Neuron"; (Research Paper); Proceeding for NANOARCH '14 Proceedings of the 2014 IEEE/ACM International Symposium on Nanoscale Architectures; Jul. 30, 2014; pp. 7-12.

Yakopcic, C. et al., "Hybrid Crossbar Architecture for a Memristor Based Memory"; (Research Paper); Apr. 9, 2013; 5 pages.

* cited by examiner

*Primary Examiner* — David Lam
(74) *Attorney, Agent, or Firm* — Fabian VanCott

(57) ABSTRACT

A method of operating a plurality of memristive cells coupled as a memristor array includes initializing a first select line, and, in parallel for a number of memristor cells in the first select line, determining whether a level of conductance of the memristor cells in the first select line are within a tolerance of a reference conductance, and, in response to a determination that the level of conductance is not within the tolerance of the reference conductance, adjusting the level of conductance for the memristor cells in the first select line.

20 Claims, 11 Drawing Sheets

US 9,691,479 B1

METHOD OF OPERATING AND APPARATUS OF MEMRISTOR ARRAYS WITH DIAGONAL LINES INTERCONNECT BETWEEN MEMRISTOR CELLS

BACKGROUND

A memristor or 'memory resistor,' sometimes also referred to as 'resistive random access memory' (RRAM or ReRAM), is a non-linear, passive, two-terminal electrical device having or exhibiting an instantaneous resistance level or state that is substantially a function of bias history. In particular, a bias such as a voltage or a current applied across terminals of the memristor may be used to set, select, or program a resistance of the memristor.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
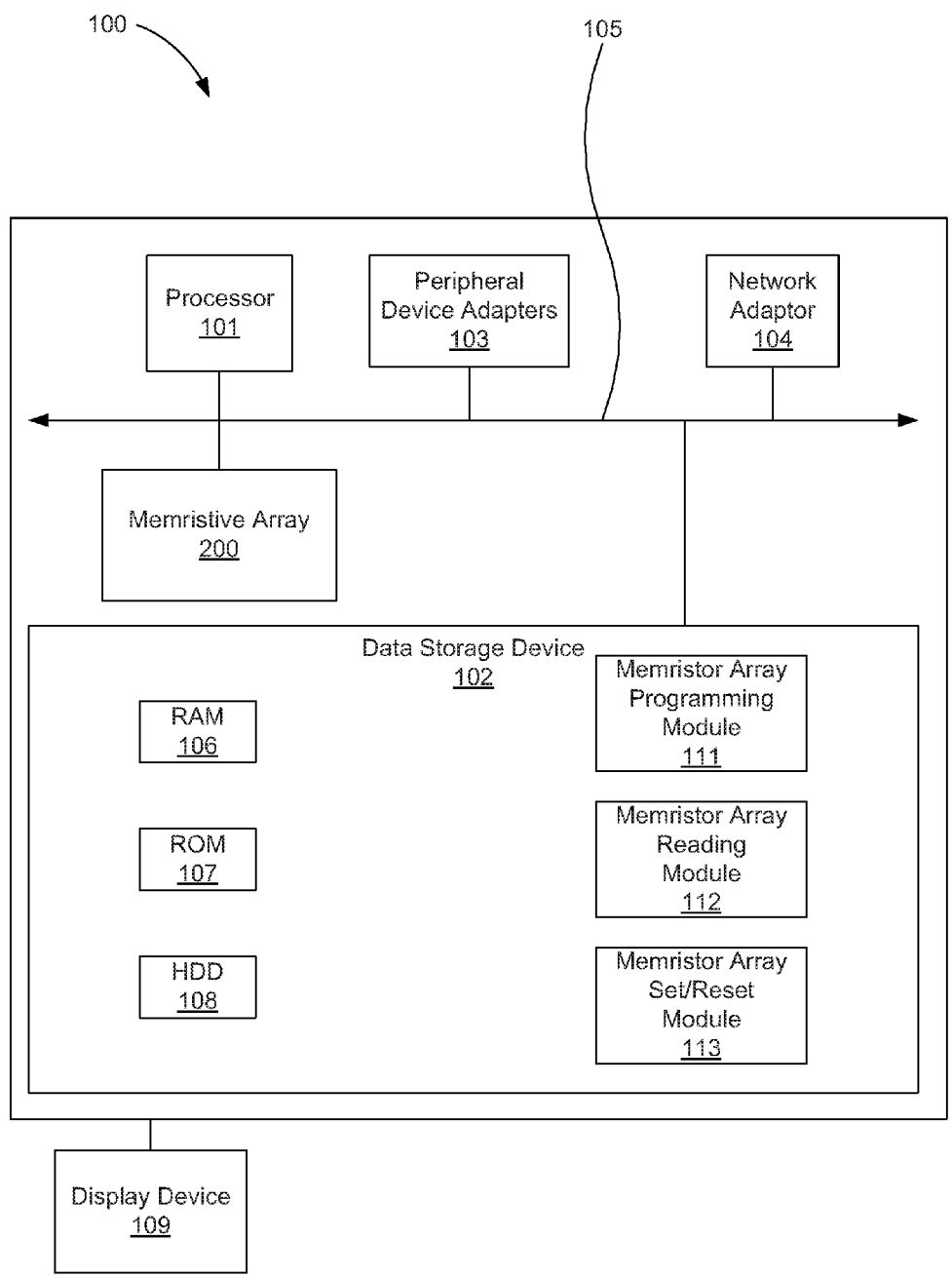
FIG. 1 is a diagram of a computing system for training and reading a memristor array, according to one example of the principles described herein.

Once programmed, a memristor may retain the programmed resistance for a specified period of time after the bias is removed such as until the memristor reprogrammed. The memristor remains in a programmed state long enough to regard the device as non-volatile. As such, a memristor is a two-terminal device that may function as a non-volatile memory where the programmed resistance is stored without the application of power to the memristor. A number of memristors may be included within an array in which a number of column lines intersect with a number of row lines at junctions, and the memristors are coupled to the column lines and the row lines at the junctions. Thus, a memristor may be used to store or process information such as, for example, data supplied it by a processing device. This information may be stored or processed by a memristor by switching a resistance state of the memristor.

A voltage source may switch the resistance state of a memristor by supplying the memristor with a voltage. In this manner, memristor arrays may be used in a variety of applications, including as non-volatile solid state memory, hardware accelerators, programmable logic, signal processing, control systems, pattern recognition, image filtering, dot product calculation, any other applications, or combinations thereof. In the case of a memory device, the memristive cells included therein may be programmed via an applied voltage to a high resistive state and a low resistive state. These resistive states may be correlated, in terms of computer memory, to a high (e.g., "1") or a low (e.g., "0") memory state. Accordingly, the memristive cells may be used to retain bit values, and multiple memristive cells may be implemented in an array, for example, to retain multiple bits or bytes in a computer memory.

In another example, the memristive cells may be switched between a plurality of different, intermediate resistance levels or states to implement a multi-state or multi-level memory cell. In this example, the different available resistive levels within a memristive cell may be used to represent values within a matrix of memristive cells that may be used, once programmed, to calculate, for example, a dot product or other analog computation.

In programming or training a memristor array in, for example, a memristor accelerator array, or when writing to a memristor array in, for example, a memristor memory device, an undesirable latency may occur due to an inability to perform a write or program action within the memristor array simultaneously or in parallel with a read of the memristor array. The lack of ability to simultaneously read and write to a memristor array is due to the architecture of the memristor array selecting each cell within the memristor array one at a time to perform either a read or a write operation. The exclusive nature of reading or writing creates a latency in the operation of the memristor array.

Examples described herein provide a method of operating a plurality of memristive cells coupled as a memristor array. The method includes initializing a first select line, and, in parallel for a number of memristor cells in the first select line, determining whether a level of conductance of the memristor cells in the first select line are within a tolerance of a reference conductance, and, in response to a determination that the level of conductance is not within the tolerance of the reference conductance, adjusting the level of conductance for the memristor cells in the first select line. In response to a determination that the level of conductance is within a tolerance of a reference conductance, the method includes initializing a second select line, and, in parallel for a number of memristor cells in the second select line, determining whether a level of conductance of the memristor cells in the second select line are within a tolerance of a reference conductance, and in response to a determination that the level of conductance is not within a tolerance of a reference conductance, adjusting the level of conductance for the memristor cells in the second select line.

The method may include determining whether a final select line within the memristor array has been initialized, and, in response to a determination that the final select line within the memristor array has not been initialized, incrementing initialization of select lines to a subsequent select line. Determining whether the level of conductance of the memristor cells in the first select line are within the tolerance of the reference conductance, and in response to a determination that the level of conductance is not within a tolerance of the reference conductance, adjusting the level of conductance for the memristor cells in the first select line includes performing a read function on the memristor cells in the first select line, sensing the conductance level of the memristor cells in the first select line, comparing the conductance level of the memristor cells in the first select line with a reference conductance, determining if the conductance level of the memristor cells in the first select line are greater than the reference conductance, in response to a determination that the conductance level of the memristor cells in the first select line are greater than the reference conductance, modifying the reset conditions and performing a reset operation, and, in response to a determination that the conductance level of the memristor cells in the first select line are less than the reference conductance, modifying the set conditions and performing a set operation.

The method includes determining the dimensions of the memristor array. If the dimension of the memristor array is n by n memristive cells, the method includes adjusting the level of conductance for the memristor cells within the memristor array. If the dimension of the memristor array is m by n memristive cells, the method includes determining if m is an integer of n, and if m is an integer of n, analyzing in series the m by n memristor array as a number of parsed n by n arrays where the number of parsed n by n arrays is equal to the quotient of m and n. If m is not an integer of n, the method includes analyzing in series the m by n memristor array as a number of parsed n by n arrays where the number of parsed n by n arrays is equal to the quotient of m and n, modifying the architecture of the remainder m by n memristor array, and analyzing in series with the parsed n by n arrays, the remainder m by n memristor array. Further, modifying the set and reset conditions includes modifying the voltage amplitude, modifying the pulse duration, or modifying the number of consecutive pulses.

Examples described herein provide a memristor array. The memristor array includes a number of row lines, a number of column lines intersecting the row lines to form a number of junctions, a number of memristive cells coupled between the row lines and the column lines at the junctions, a number of first diagonal lines coupled between the memristive cells in a first direction, and a number of second diagonal lines coupled between the memristive cells in a second direction. The memristive cells are trained via application of a voltage via the first and second diagonal lines.

A number of select line drivers may be included in the memristor array to select a row of the memristor array. Selection of a first select line driver during a programming process causes a programming voltage to be directed via the first and second diagonal lines coupled to the first select line driver.

The memristor array may include a column decoder. The column decoder includes a first set of a number of electrode driver and electrode sensor pairs, and a first set of switches for each electrode driver and electrode sensor pair of the first set of electrode driver and electrode sensor pairs to switch between the electrode drivers and the electrode sensors of the first set of electrode driver and electrode sensor pairs. The memristor array may include a row decoder. The row decoder includes a second set of a number of electrode driver and electrode sensor pairs, and a second set of switches for each electrode driver and electrode sensor pair of the second set of electrode driver and electrode sensor pairs to switch between the electrode drivers and the electrode sensors of the second set of electrode driver and electrode sensor pairs. The electrode drivers of the first and second sets of the electrode driver and electrode sensor pairs drive a voltage to write to a number of the memristive cells. The electrode sensors of the first and second sets of the electrode driver and electrode sensor pairs sense a current from a number of the memristive cells.

Selection between the electrode drivers and the electrode sensors of the first and second sets of electrode driver and electrode sensor pairs are performed in parallel to allow for each memristor cell in a first select line to be simultaneously either programmed or read. The memristor cells are multi-level cells wherein the row lines, the column lines, the first diagonal lines, and the second diagonal lines are positioned on separate levels of the memristor cells. In one example, the memristive cells comprise two transistors and one-resistor (2T1R). In another example, the memristive cells comprise one transistor and one-resistor (1T1R). In one example, the memristor array is a memristor memory array. In another example, the memristor array is a memristive accelerator array.

As used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1 is a diagram of a computing system (100) for programming and reading a memristor array, according to one example of the principles described herein. The computing system (100) may be implemented in an electronic device. Examples of electronic devices include servers, desktop computers, laptop computers, personal digital assistants (PDAs), mobile devices, smartphones, neural networks, radio-frequency identification (RFID) systems, gaming systems, and tablets, among other electronic devices.

The computing system (100) may be utilized in any data processing scenario including, stand-alone hardware, mobile applications, through a computing network, or combinations thereof. Further, the computing system (100) may be used in a computing network, a public cloud network, a private cloud network, a hybrid cloud network, other forms of networks, or combinations thereof. In one example, the methods provided by the computing system (100) are provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system (100) are executed by a local administrator.

To achieve its desired functionality, the computing system (100) includes various hardware components. Among these hardware components may be a number of processors (101), a number of data storage devices (102), a number of peripheral device adapters (103), a number of network adapters (104), and a memristor array (200). These hardware components may be interconnected through the use of a number of busses and/or network connections. In one example, the processor (101), data storage device (102), peripheral device adapter (103), network adapter (104), and memristor array (200) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of initializing a first select line, and, in parallel for a number of memristor cells in the first select line, determining whether a level of conductance of the memristor cells in the first select line are within a tolerance of a reference conductance, and in response to a determination that the level of conductance is not within the tolerance of the reference conductance, adjusting the level of conductance for the memristor cells in the first select line. The executable code may, when executed by the processor (101), also cause the processor (101) to implement at least the functionality of, in response to a determination that the level of conductance is within a tolerance of a reference conductance, initializing a second select line, and, in parallel for a number of memristor cells in the second select line, determining whether a level of conductance of the memristor cells in the second select line are within a tolerance of a reference conductance, and in response to a determination that the level of conductance is not within a tolerance of a reference conductance, adjusting the level of conductance for the memristor cells in the second select line. Other functionality of the processor (101) is described herein and claimed below. The functionality of the computing system (100) is in accordance to the methods of the present specification described herein. In the course of executing code, the processor (101) may receive input from and provide output to a number of the remaining hardware units.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106).

The data storage device (102) may include a computer readable medium, a computer readable storage medium, or a non-transitory computer readable medium, among others. For example, the data storage device (102) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the computing system (100) enable the processor (101) to interface with various other hardware elements, external and internal to the computing system (100). For example, the peripheral device adapters (103) may provide an interface to input/output devices, such as, for example, display device (109), a mouse, or a keyboard. The peripheral device adapters (103) may also provide access to other external devices such as an external storage device, a number of network devices such as, for example, servers, switches, and routers, client devices, other types of computing devices, and combinations thereof.

The display device (109) may be provided to allow a user of the computing system (100) to interact with and implement the functionality of the computing system (100). The peripheral device adapters (103) may also create an interface between the processor (101) and the display device (109), a printer, or other media output devices. The network adapter (104) may provide an interface to other computing devices within, for example, a network, thereby enabling the transmission of data between the computing system (100) and other devices located within the network.

The computing system (100) may, when executed by the processor (101), display the number of graphical user interfaces (GUIs) on the display device (109) associated with the executable program code representing the number of applications stored on the data storage device (102). The GUIs may display, for example, interactive screenshots that allow a user to interact with the computing system (100) to input instructions to program and/or read the memristor array (200) as will be described in more detail below. Additionally, via making a number of interactive gestures on the GUIs of the display device (109), a user may obtain information based on the input data. Examples of display devices (109) include a computer screen, a laptop screen, a mobile device screen, a personal digital assistant (PDA) screen, and a tablet screen, among other display devices (106).

The computing system (100) may further include a memristor array (200). As will be described in more detail below, memristor array (200) includes a number of elements including a number of memristors that function together within an array to perform data processes and data storage. The memristor array (200) may be used in a number of applications. For example, the memristor array (200) may be used to store data, accelerate computing processes, programming logic, processing signals, controlling computing systems, recognizing patterns, and calculating dot products, among many other applications. As to process acceleration, the memristor array (200) may be used as an accelerator in which the memristor array (200) performs a number of functions faster than is possible in software running on a more general-purpose processing device. Although the memristor array (200) is depicted as being a device internal to the computing system (100), in another example, the memristor array (200) may be a peripheral device coupled to the computing system (100) or included within a peripheral device coupled to the computing system (100).

The computing system (100) further includes a number of modules used in the implementation of the systems and methods described herein. The various modules within the computing system (100) include executable program code that may be executed separately. In this example, the various modules may be stored as separate computer program products. In another example, the various modules within the computing system (100) may be combined within a number of computer program products; each computer program product includes a number of the modules.

The computing system (100) may include a memristor array programming module (111) to, when executed by the processor (101), cause a number of memristive cells within the memristor array (200) to be programmed or trained. The memristor array programming module (111), for example, receives a number of input values defining a voltage or a current value to be applied to a number of the memristive cells within the memristor array (200). Thus, the memristor array programming module (111) may send the input values to the memristor array (200) as programming signals to a number of memristors within the memristor array (200) to program the memristors.

The computing system (100) may include a memristor array reading module (112) to, when executed by the processor (101), cause a number of memristive cells within the memristor array (200) to be read. The memristor array reading module (112), for example, receives instructions to read values defining a voltage or a current value existent on a number of the memristive cells within the memristor array (200). Thus, the memristor array reading module (111) may send the instructions to the memristor array (200) as reading signals to a number of memristors within the memristor array (200) to read the memristors.

The computing system (100) may include a memristor array set/reset module (113) to, when executed by the processor (101), cause a number of memristive cells within the memristor array (200) to be set and/or reset. A reset operation causes a selected memristive cell (203) to be prepared for programming. Application of voltage between a column decoder (210) and a row decoder (211), for example, sets the memristive cell (203) being set/reset to a high resistance state and a low resistance state. A set operation switches the device from the high resistance state to the low resistance state, and a reset operation does the reverse, or visa versa. Thus, the memristor array reading module (112), for example, receives instructions to read values defining a voltage or a current value existent on a number of the memristive cells within the memristor array (200). The memristor array set/reset module (113) may send the instructions to the memristor array (200) as set/reset signals to a number of memristors (203) within the memristor array (200) to set and reset the memristors.

Figure 2:
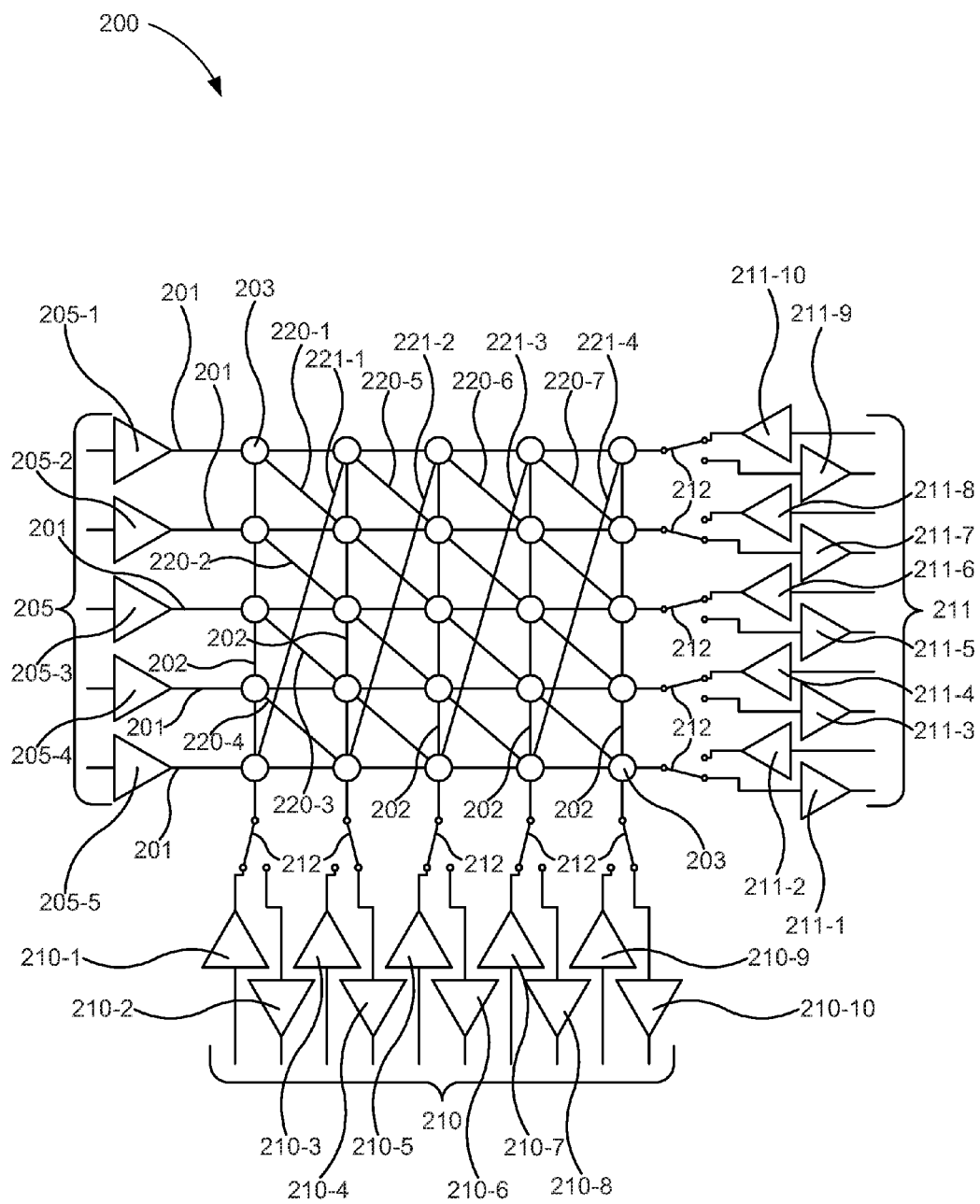
FIG. 2 is an array diagram of the memristor array used within the computing system of FIG. 1, according to one example of the principles described herein.

Turning again to the figures, FIG. 2 is an array diagram of the memristor array (200) used within the computing system (100) of FIG. 1, according to one example of the principles described herein. Though FIG. 2 is a schematic diagram, its elements also represent distinct features of the physical implementation such as the physical layout of the memristive cells (203) and the direction and orientation of the memristor array's (200) metal interconnect wires. The memristor array (200) may include a number of electrically conductive row lines (201) and a number of electrically conductive column lines (202). Even though five row lines (201) and five column lines (202) are depicted in FIG. 2, any number of row lines (201) and column lines (202) may be present in the memristor array (200). The row lines (201) and column lines (202) intersect at junctions, and number of resistive memory devices, "memristors," or "memristive cells" (203) are located at the junctions as indicated by the circles. A memristive cell (203) is any passive two-terminal circuit element that maintains a functional relationship between the time integral of current (i.e., charge) and the time integral of voltage (i.e., flux) where the slope of this function is called the memristance, denoted as "M." The memristive cells (203) electrically couple the row lines (201) to the column lines (202). The row lines (201) and the column lines (202) are used to read memristive cells (203) along the row lines (201) and the column lines (202). In one example, the memristive array (200) includes any number of row lines (201) and column lines (202) to create a rectangular memristive array (200) by way of the number of memristive cells (203) within the memristive array (200). Thus, in one example, the memristive array (200) may be a squared array such as an n by n array. In another example, the memristive array (200) may be a non-squared m by n array where m is greater than n.

Further, the memristor array (200) includes a number of electrically conductive diagonal lines (220-1, 220-2, 220-3, 220-4, 220-5, 220-6, 220-7, 221-1, 221-2, 221-3, 221-4), collectively referred to herein as 220 and 221, respectively. The diagonal lines (220) travel from a north-west to a south-east direction, and the diagonal lines (221) travel from a south-west to a north-east direction. A via is included in each of the memristive cells (203) to electrically couple diagonal lines (220) with diagonal lines (221) when these two differently angled lines are used together to activate memristive cells (203). For example, a via is included in the memristive cell (203) that couples diagonal line (220-2) and (221-4). Thus, while the row lines (201) and column lines (202) are implemented as Manhattan-routed interconnects in the physical layout of the memristive array (200), the first and second diagonal lines (220, 221) are, instead, implemented using X-routed interconnects in the physical implementation of the memristive array (200).

The diagonal lines (220, 221) electrically couple a first memristive cell (203) located in a first row and a first column with a second memristive cell (203) located in a second row and a second column. In this manner, the diagonal lines (220, 221) connect two memristive cells (203) that are located on different row lines (201) and column lines (202). As will be described in more detail below, the electrically conductive diagonal lines (220, 221) are used during programming or training of the memristor array (200). As depicted in FIG. 2, and the reminder of the figures, none of the lines including the row lines (201), the column lines (202), and the diagonal lines (220, 221) intersect within the memristor array (200), but are located on different interconnect levels within, for example, the material the memristive array (200) is formed. For example, the column lines (202) may be on a first metal interconnect layer or level of the memristive array (200), the row lines (201) may be on a second metal interconnect layer or level of the memristive array (200), the diagonal lines (220) traveling from a northwest to a south-east direction may be on a third metal interconnect layer or level of the memristive array (200), and the diagonal lines (221) traveling from a south-west to a north-east direction may be on a fourth metal interconnect layer or level of the memristive array (200). However, the different lines may be located on any of these levels as long as the levels remain exclusive to the different types of lines. Further, the memristive array (200) may include more than four layers as long as the types of lines do not intersect.

A number of select line drivers (205-1, 205-2, 205-3, 205-4, 205-5), collectively referred to herein as 205, may be included in the memristor array (200). The select line drivers (205) may be activated by, for example, the processor (101) executing the memristor array programming module (111), the memristor array reading module (112), or a combination thereof. The select line drivers (205) are activated to access a number of memristive cells (203) to perform a programming or reading process at those memristive cells (203).

The memristive array (200) includes a column decoder (210) and a row decoder (211). The column decoder (210) includes a number of electrode drivers (210-1, 210-3, 210-5, 210-7, 210-9) and a number of electrode sensors (210-2, 210-4, 210-6, 210-8, 210-10), collectively referred to as 210. The electrode drivers and sensors (210) are included as pairs within the memristive array (200), and, thus, for example, electrode driver (210-1) is paired with electrode sensor (210-2), electrode driver (210-3) is paired with electrode sensor (210-4), electrode driver (210-5) is paired with electrode sensor (210-6), and so on until the last column of the memristive array (200).

The row decoder (211) similarly includes a number of electrode drivers (211-1, 211-3, 211-5, 211-7, 211-9) and a number of electrode sensors (211-2, 211-4, 211-6, 211-8, 211-10), collectively referred to as 211. The electrode drivers and sensors (211) are included as pairs within the memristive array (200), and, thus, for example, electrode driver (211-1) is paired with electrode sensor (211-2), electrode driver (211-3) is paired with electrode sensor (211-4), electrode driver (211-5) is paired with electrode sensor (211-6), and so on until the last row of the memristive array (200).

The electrode drivers of the column decoder (210) and row decoder (211) are used to write to a number of memristive cells (203) within the memristor array (200). Writing to a memristive cell (203) includes applying a voltage to the memristive cell (203). In one example where the memristor array (200) is used as a memory device, the voltage may place the memristive cell (203) at a low or high resistance state to indicate a 1 or a 0, where each memristive cell (203) in the memristor array (200) is a bit.

In another example where the memristor array (200) is used as an accelerator device, the voltage may place the memristive cell (203) at any level of conductance in order to represent any number, where each memristive cell (203) in the memristor array (200) represents a value within a computation. In this example, the computation may be, for example, a dot product computation where the conductance levels within the memristive cells (203) of the row lines (201) and the column lines (202) are the vector values, and the sensed current equals a dot product of the matrix values and vector values. Thus, the dot product is the product of two vectors to form a scalar, whose value is the product of the magnitudes of the vectors and the cosine of the angle between them. Thus, in this example, the vectors may be represented as matrices that may be multiplied to obtain the dot product. A dot product calculation is a computationally expensive task for a computing device. This may be especially true when the matrices are not sparse or symmetric, such as in the case of dense matrices. A symmetric matrix is a square matrix that is equal to its transpose. Sparse matrices are matrices in which most of the elements are zero. In contrast, if most of the elements in the matrix are nonzero, then the matrix is considered dense. The memristor array programming module (111), for example, receives a number of input values from the processor (101) defining a matrix to be processed in a dot product mathematical calculation. The memristor array programming module (111) may send the input values to the memristor array (200) as programming signals to a number of memristive cells (203) within the memristive array (200) to program or write to the memristive cells (203). The memristor array programming module (111) may also receive a vector input to be processed in connection with the matrix programmed into the memristive cells (203), and obtain a value representing the dot product. This value may be conveyed as data to the computing system (100) or another computing device for analysis or further processing.

Turning again to FIG. 2, each pair of electrode drivers (210-1, 210-3, 210-5, 210-7, 210-9, 211-1, 211-3, 211-5, 211-7, 211-9) and electrode sensors (210-2, 210-4, 210-6, 210-8, 210-10, 211-2, 211-4, 211-6, 211-8, 211-10) of the column decoder (210) and the row decoder (211) include a switch (212). The switches (212) of the electrode drivers and electrode sensors are switched based on instructions from the processor (101) to the memristor array programming module (111) and the memristor array reading module (112) to program or read, respectively, the memristive cells (203). In one example, the positioning of the switches (212) along with the driver signals may be controlled by digital control logic such as, for example, a field-programmable gate array (FPGA), a micro-processor, another other digital unit, or combinations thereof. In one example, the control logic may also receive the sensor signals as inputs and performs any type of closed-loop algorithm for programming the selected cells in the memristor array (200).

Throughout the examples described herein, the terms programming, training, writing, or similar language when used in connection with memristive cells (203), are used to describe any action that imparts a voltage to a number of the memristive cells (203) to change the conductance level of the memristive cells (203) to represent a value; the conductance level being a value inverse to the resistivity level of the memristive cells (203). Further, throughout the examples described herein, the terms sensing, measuring, or reading, when used in connection with memristive cells (203), are used to describe any action that detects the conductance level of a number of the memristive cells (203) to determine the value of the memristive cells (203) and provide those values to, for example, the processor (101) for computation.

In order to read a number of memristive cells (203) within the memristor array (200), the processor instructs the memristor array reading module (112) to select a row line (201) through activation of a select line driver (205). In order to obtain a number of values or a calculation of those values from a number of memristive cells (203) within a column line (202), the processor instructs the memristor array reading module (112) to switch at least one of the switches (212) to electrically couple the electrode sensors (210-2, 210-4, 210-6, 210-8, 210-10) of the column decoder (210) to the column line (202). Such an electrical coupling is depicted, for example, with regard to electrode sensors 210-4 and 210-10 of FIG. 2.

Similarly, in order to obtain a number of values or a calculation of those values from a number of memristive cells (203) within a row line (201), the processor instructs the memristor array reading module (112) to switch at least one of the switches (212) to electrically couple the electrode sensors (211-2, 211-4, 211-6, 211-8, 211-10) of the row decoder (211) to the row line (202). Such an electrical coupling is depicted, for example, with regard to electrode sensors 211-4, 211-6, and 211-10 of FIG. 2.

In order to program a number of memristive cells (203) within the memristor array (200), the diagonal lines (220, 221) are used as mentioned above. For example, the processor instructs the memristor array programming module (111) to select a row line (201) through activation of a select line driver (205). In order to drive a voltage to a number of memristive cells (203) within the diagonal lines (220, 221), the processor executes the memristor array programming module (111) to switch at least one of the switches (212) to electrically couple the electrode drivers (210-1, 210-3, 210-5, 210-7, 210-9) of the column decoder (210) to the column line (202). Such an electrical coupling is depicted, for example, with regard to electrode drivers 210-1, 210-5, and 210-7 of FIG. 2.

Examples of a programming of the memristive cells (203) in the memristor array (200) of FIG. 2 will now be described. Programming of the cells occurs as a select line driver (205) is activated and a number of the electrode drivers (210-1, 210-3, 210-5, 210-7, 210-9) are switched, via the switches (212), to couple the electrode drivers (210-1, 210-3, 210-5, 210-7, 210-9) to their respective column lines (202). For example, activation of the first select line driver (205-1) will result in the ability to program any number of the memristive cells (203) along diagonal line (220-1). Further, activation of the second select line driver (205-2) will result in the ability to program any number of the memristive cells (203) along diagonal line (220-2) and diagonal line (221-4). Activation of the third select line driver (205-3) will result in the ability to program any number of the memristive cells (203) along diagonal line (220-3), diagonal line (221-3), and diagonal line (220-7). Activation of the fourth select line driver (205-4) will result in result in the ability to program any number of the memristive cells (203) along diagonal line (220-4), diagonal line (221-2), and diagonal line (220-6). Activation of the fifth select line driver (205-5) will result in result in the ability to program any number of the memristive cells (203) along diagonal line (221-2), and diagonal line (220-5).

As part of a preliminary preparation before programming of the memristive cells (203), or in between programming processes, a set/reset process may be executed. The processor (101), executing the memristor array set/reset module (113), instructs the column decoder (210) and the row decoder (211) to apply set and reset voltages to a number of the memristive cells (203) within the memristor array (200). The voltages are applied via the electrode drivers (210-1, 210-3, 210-5, 210-7, 210-9, 211-1, 211-3, 211-5, 211-7, 211-9) as switched and coupled to the row lines (201) and the column lines (202). In one example, during a set/reset operation, a set voltage is applied by a first of the electrode drivers (210, 211) in a first direction, and a reset voltage is applied by the other of the electrode drivers (210, 211) in the opposite direction. More regarding the set/reset operation will be described below in connection with the programming of the memristive cells (203).

Because the memristor array (200) can switch between the electrode drivers (210-1, 210-3, 210-5, 210-7, 210-9, 211-1, 211-3, 211-5, 211-7, 211-9) and electrode sensors (210-2, 210-4, 210-6, 210-8, 210-10, 211-2, 211-4, 211-6, 211-8, 211-10) of the column decoder (210) and the row decoder (211), a first memristive cell (203) within a selected line may be programmed at the same time a second memristive cell (203) in the selected line is read. Further, this means that all the memristive cells (203) in a selected line may be independently, and in parallel, programmed. This parallel programming of the memristive cells (203) reduces the number of programming processes from $n^2$ number of programming processes to n programming processes in a square memristor array (200). Further, for non-square memristive arrays (200) such as an m by n array where m is greater than n, the reduction in programming addresses moves from an m*n number of programming processes to n programming processes. The reduction in programming time decreases the latency of programming the memristor array (200) and increases the usefulness of memristor-based accelerators and memory devices by providing a more responsive memristor array (200).

Figure 3:
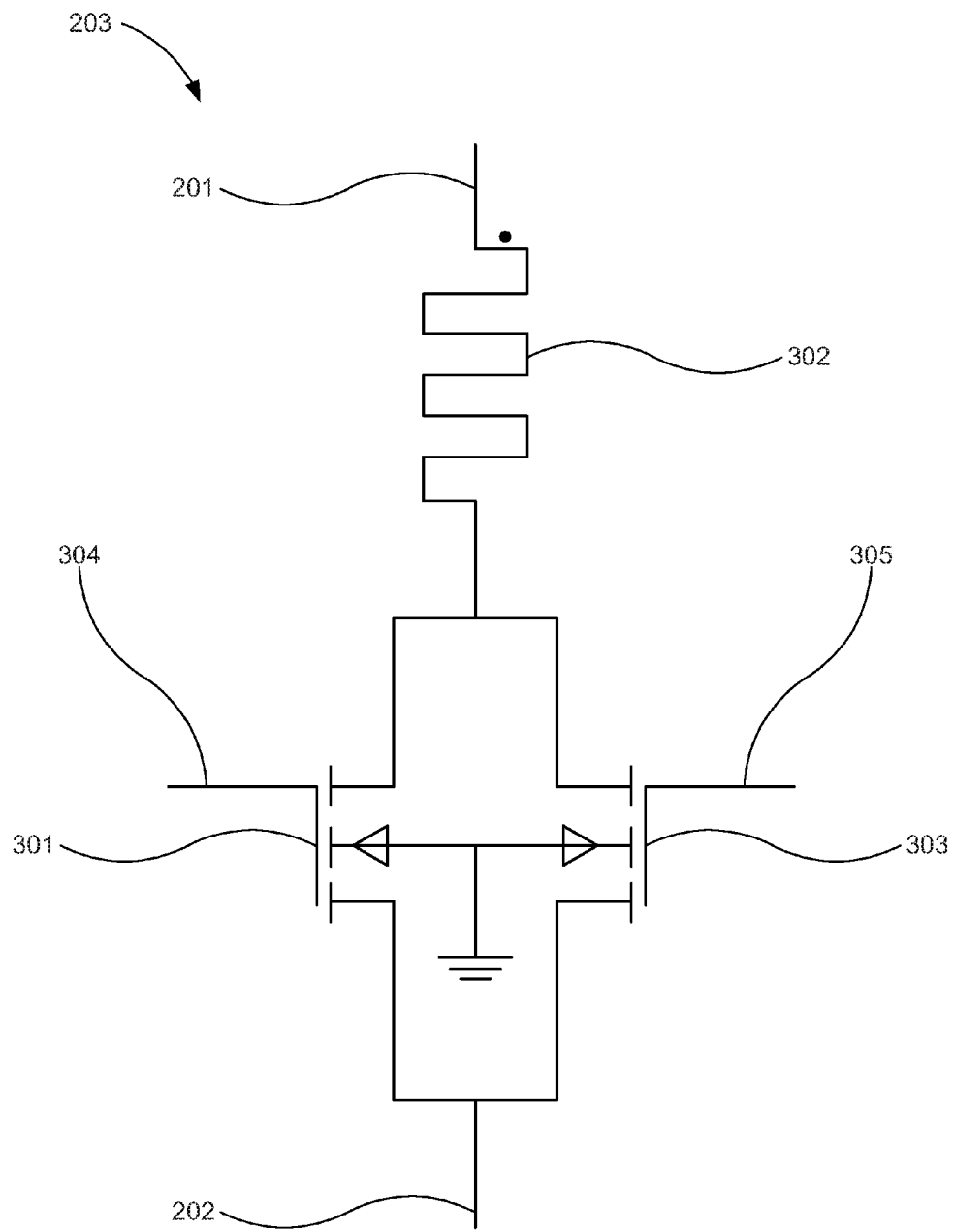
FIG. 3 is a circuit diagram of the memristive cells within the memristor array of FIG. 2, according to one example of the principles described herein.

FIG. 3 is a circuit diagram of the memristive cells (230) within the memristor array (200) of FIG. 2, according to one example of the principles described herein. In the example of FIG. 3, the memristive cells (203) include two transistors (301, 303) and one resistor (302), and may be referred to as a two-transistor-one-resistor (2T1R) memristive cell (203). In another example, the memristive cells (203) may include one transistor and one resistor, and may be referred to as a one-transistor-one-resistor (1T1R) memristive cell (203) as depicted in, for example, FIG. 9. In another example, the memristive cells (203) may include any number of transistors and one resistor, and may be referred to as an n-transistor-one-resistor (nT1R) memristive cell (203).

The memristor cell (203) is coupled to a row line (201) and a column line (202) at the ends. The row line (201) is coupled to the resistor (302). Further, a programming select line (304) is coupled to a first transistor (301), and a read select line (305) is coupled to a second transistor (303). The lines coming out of select line drivers (205) as depicted in FIG. 2 are coupled to the gates of the memristive cells (203) as depicted in FIG. 3. It is through the programming select line (304) that the programming of the memristive cell (203) is accomplished.

Further, it is through the read select line (305) that the memristive cells (203) are read. For example, and all the gates of the read select line (305) of the memristive cells (203) located on the same column line (202) are coupled to the column line (202) in order to read the memristive cells (203) included on that column line (202) and perform calculations, for example. The same is true for all the memristive cells (203) in a given row line (201), and selection of the column lines (202) and the row lines (201) are based on the electrode sensors (210-2, 210-4, 210-6, 210-8, 210-10, 211-2, 211-4, 211-6, 211-8, 211-10) being coupled to the column lines (202) and the row lines (201), respectively, via the switched (212). In this manner, the current of the memristive cells (203) in the row lines (201) and the column lines (202) may be measured and used to compute, for example, a dot product or another calculation based in the values stored within the memristive cells (203) of the memristor array (200).

Figure 4A:
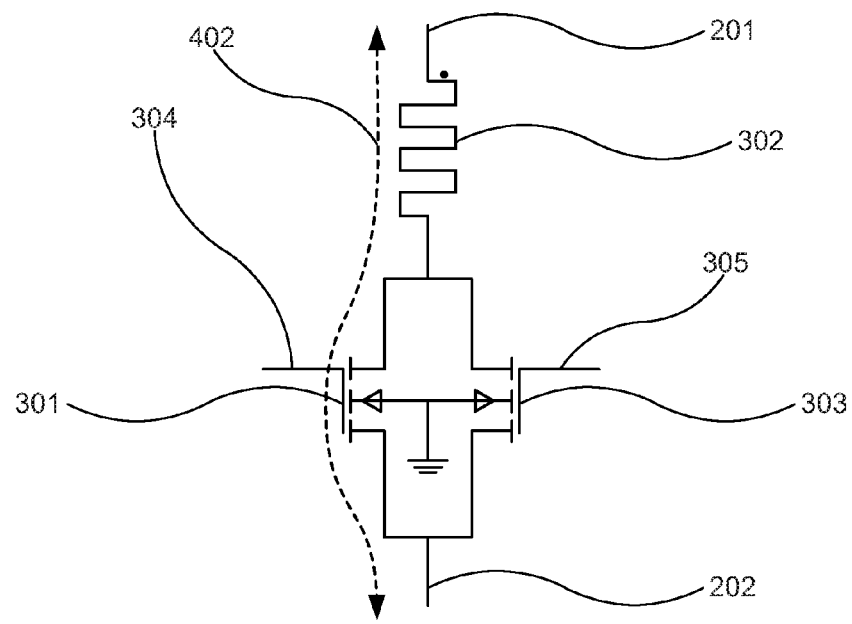
FIG. 4A is a circuit diagram and corresponding array diagram of the memristor array of FIG. 2 and the memristive cells within the memristor array during a programming process, according to one example of the principles described herein.
Figure 4A:
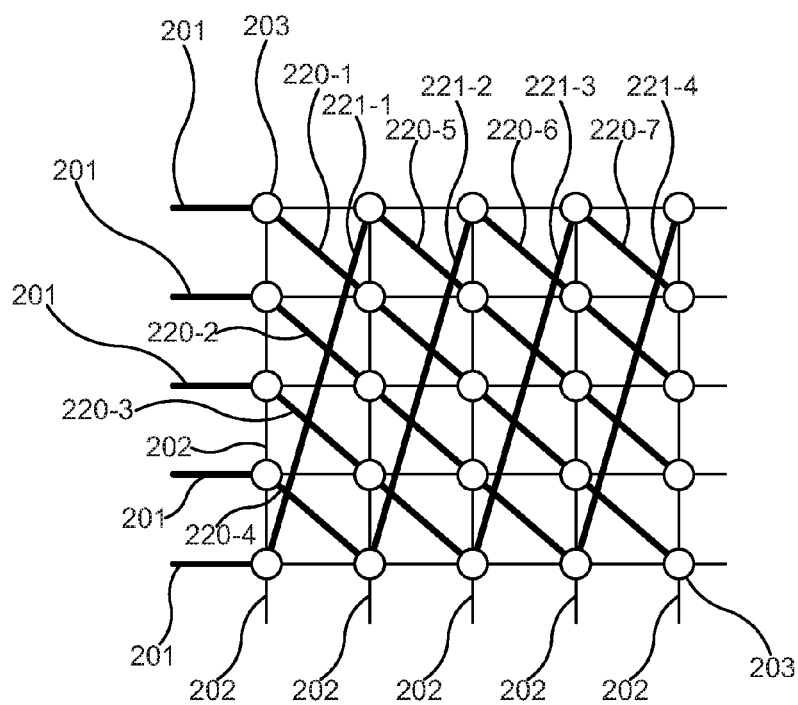
Figure 4B:
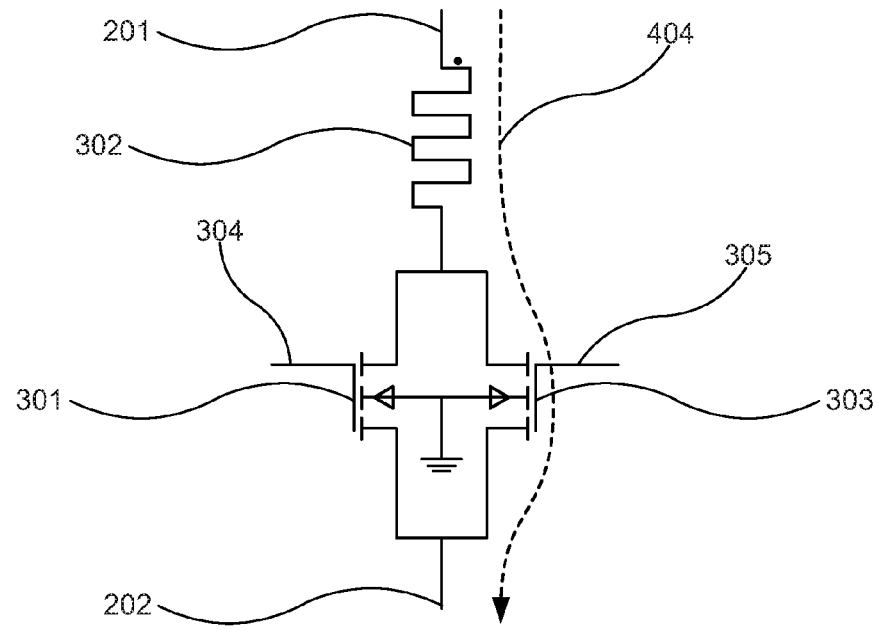
FIG. 4B is a circuit diagram and corresponding array diagram of the memristor array of FIG. 2 and the memristive cells within the memristor array during a reading process, according to one example of the principles described herein.
Figure 4B:
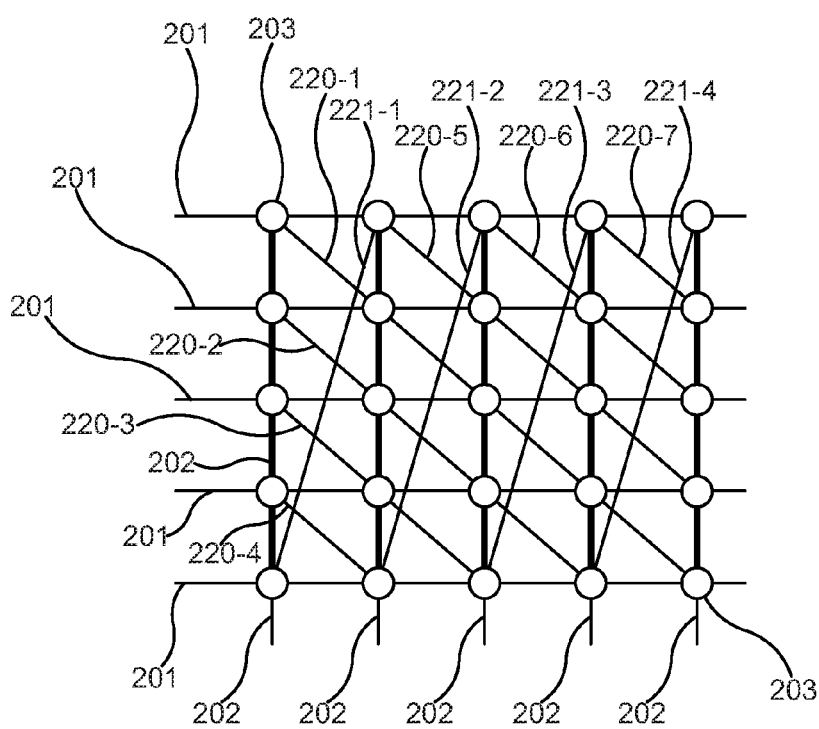

FIG. 4A is a circuit diagram and corresponding array diagram of the memristor array (200) of FIG. 2 and the memristive cells (203) within the memristor array (200) during a programming process, according to one example of the principles described herein. FIG. 4B is a circuit diagram and corresponding array diagram of the memristor array (200) of FIG. 2 and the memristive cells (203) within the memristor array (200) during a reading process, according to one example of the principles described herein. The peripheral circuitry has been removed for clarity. In FIG. 4A, the circuit diagram depicts a current flow (402) that runs through the resistor (302), through the first transistor (301) located on the programming select line (305), and through the column line (202). In one example, the biasing scheme depicted in FIG. 4A may be reversed. The corresponding activated lines include the diagonal lines (220, 221) within the memristor array (200) as indicated by the heavier lines within the array diagram of FIG. 4A. In this manner, the memristive cells (203) within the memristor array (200) may be programmed.

FIG. 4B, in contrast, depicts a read operation. In FIG. 4B, the circuit diagram depicts a current flow (404) that runs through the resistor (302), through the second transistor (303) located on the read select line (305), and through the column line (202). In one example, the current may flow in the direction opposite of the arrow depicted as the current flow (404). The corresponding activated lines include the column lines (202) within the memristor array (200) as indicated by the heavier lines within the array diagram of FIG. 4B. Each memristive cell (203) within a given column line (202) is sensed. The row lines (201) may also be read in a similar manner by activating a number of the electrode sensors (211-2, 211-4, 211-6, 211-8, 211-10) of the row decoder (211). In this manner, the memristive cells (203) within the memristor array (200) may be read.

Figure 5:
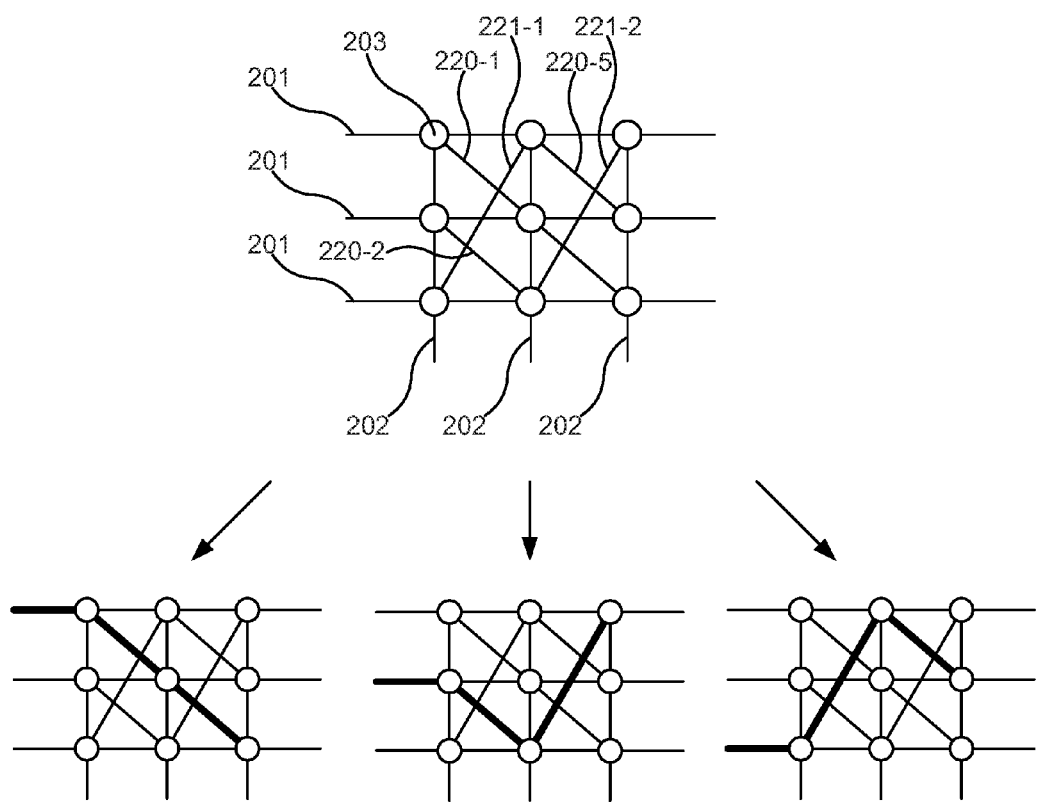
FIG. 5 is an array diagram of the memristor array of FIG. 2 depicting several select line paths, according to one example of the principles described herein.

FIG. 5 is an array diagram of the memristor array of FIG. 2 depicting several select line paths, according to one example of the principles described herein. Again, the peripheral circuitry has been removed for clarity. The memristor array (200) depicted in FIG. 5 is a three by three array including nine memristive cells (203). However, a memristive array (200) of any width and height may utilize the programming methods described herein. The select line paths of the memristor array (200) are depicted. With reference to both FIGS. 2 and 5, once a select line driver (205) is selected, a number of the memristive cells are activated. In the first case, when the top select line driver (205-1) is selected, the three memristive cells (203) in the diagonal line 220-1 are activated. When the middle select line driver (205-2) is activated, the memristive cells (203) in diagonal line (220-2) and diagonal line (221-2) are activated. When the bottom select line driver (205-3) is activated, the memristive cells (203) in diagonal line (221-1) and diagonal line (220-5) are activated. In this manner, all the memristive cells (203) within the memristor array (200) may be activated and accessed for a programming operation.

Figure 6A:
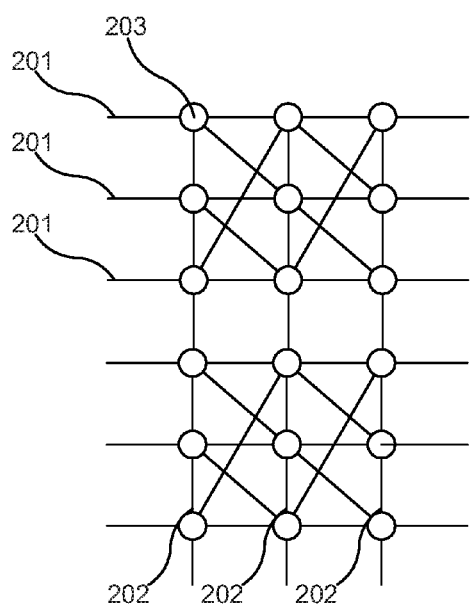
FIG. 6A is an array diagram of the memristor array of FIG. 2 depicting several select line paths of an m by n-sized array, according to one example of the principles described herein.
Figure 6B:
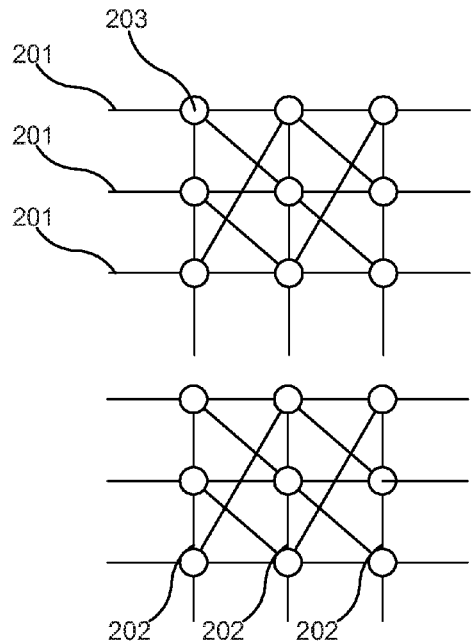
FIG. 6B is an array diagram of the memristor array of FIG. 2 depicting several select line paths of an m by n-sized array after a logical separation of the m by n-sized array, according to one example of the principles described herein.

FIG. 6A is an array diagram of the memristor array (200) of FIG. 2 depicting several select line paths of an m by n-sized array, according to one example of the principles described herein. FIG. 6B is an array diagram of the memristor array (200) of FIG. 2 depicting several select line paths of an m by n-sized array after a logical separation of the m by n-sized array, according to one example of the principles described herein. The memristor array (200) of FIG. 2 is an example of a square array where the last select line driver (205) includes a diagonal off of its first memristive cell (203) that leads to the top of the next column line (202). However, some memristor arrays (200) may not be square as depicted in FIGS. 6A through 6D. For a non-square, rectangular array where the number of memristive cells (203) included in the memristor array (200) creates an m by n-sized array, where m is greater than n (m>n), the architecture is somewhat different. An example of a six by three memristor array (200) is depicted in FIGS. 6A and 6B. The peripheral circuitry has been removed for clarity.

In the example of FIGS. 6A and 6B, the number of training processes is reduced to m number of training processes. In other words, in order to access each memristive cell (203) in the memristor array (200), at least m different select line paths are taken by the processor (101). However, in order to further reduce the number of training processes, an m by n-sized memristor array (200) may be partitioned into subsets of squared arrays where the number of training processes will reduce to 'n'. In fact, as long as m is greater than and integer of n (i.e. m>an), where 'a' is a positive integer, the memristor array (200) may be parsed into a plurality of n by n matrices during a programming process. This parsing of the m by n-sized memristor array (200) may be performed by the processor (101) of the computing device (100) executing the memristor array programming module (111) to logically divide the m by n memristive array (200) into the "a" number of memristor arrays (200). Thus, as depicted in FIG. 6B, the six by three memristor array (200) may be logically divided into two square, three by three-sized memristor arrays (200), and programming and reading of the memristor arrays (200) may proceed as described herein.

Figure 6C:
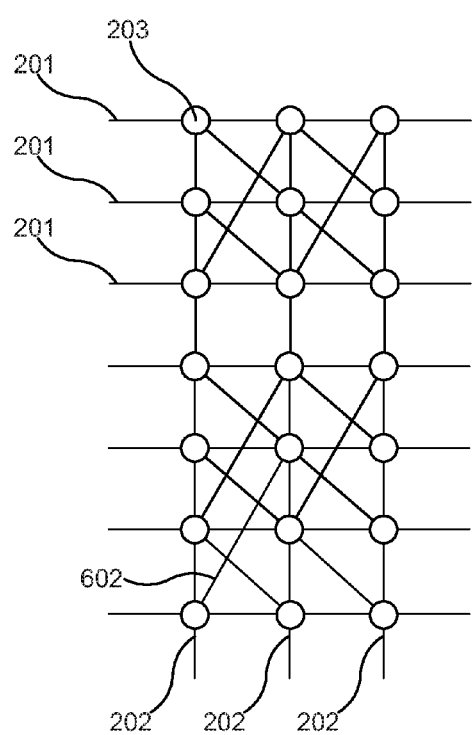
FIG. 6C is an array diagram of the memristor array of FIG. 2 depicting several select line paths of an m by n-sized array, according to another example of the principles described herein.
Figure 6D:
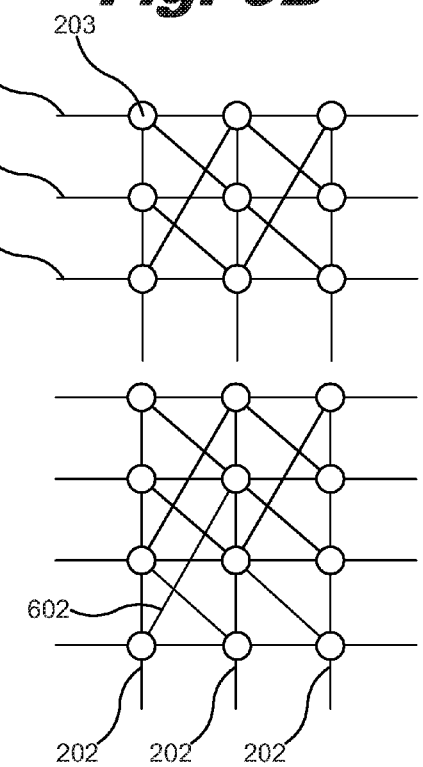
FIG. 6D is an array diagram of the memristor array of FIG. 2 depicting several select line paths of an m by n-sized array after a logical separation of the m by n-sized array, according to another example of the principles described herein.

However, in some examples of an m by an-sized memristor array (200), "a" may not be an integer of n. such an example is depicted in FIGS. 6C and 6D. FIG. 6C is an array diagram of the memristor array (200) of FIG. 2 depicting several select line paths of an m by n-sized array, according to another example of the principles described herein. Further, FIG. 6D is an array diagram of the memristor array (200) of FIG. 2 depicting several select line paths of an m by n-sized array after a logical separation of the m by n-sized array, according to another example of the principles described herein. In the example of FIGS. 6C and 6D, if "a" is not an integer of n, then the architecture within the memristor array (200) may be modified to accommodate the extra connections. The memristor array (200) of FIGS. 6C and 6D is a seven by three array. Since three is not an integer of seven, an additional connection (602) within the architecture of the memristor array (200) may be added to ensure that all the memristive cells (203) are addressable. FIG. 6D depicts the seven by three memristive array (200) in a parsed state where a three by three square memristive array and a four by three remainder memristive array are parsed. In some examples the logic control for accessing the additional connection (602) and addressing the memristive cells (203) therein may be considered in order to minimize the number of programming connections.

The examples of FIGS. 6A through 6D provide a decrease in the time it takes to program the memristive array (200). Further, in the case of FIGS. 6C and 6D, the addition of architecture, although resulting in a non-uniform array, still provides for a decrease in programming time. In one example, the examples of FIGS. 6A through 6D may include additional electrode drivers and electrode sensors.

The non-square and non-integer examples of FIGS. 6A through 6D may be brought about due the nature of the calculations the memristor array (200) is to perform. Further, throughout the examples of memristive arrays (200) described herein, relatively small numbers of memristive cells (203) are depicted. However, in reality memristor array (200) sizes may be of any value including, for example, hundreds, thousand, tens of thousands, hundreds of thousands, millions, or more memristive cells (203) may be included within a memristive array (200).

Figure 7:
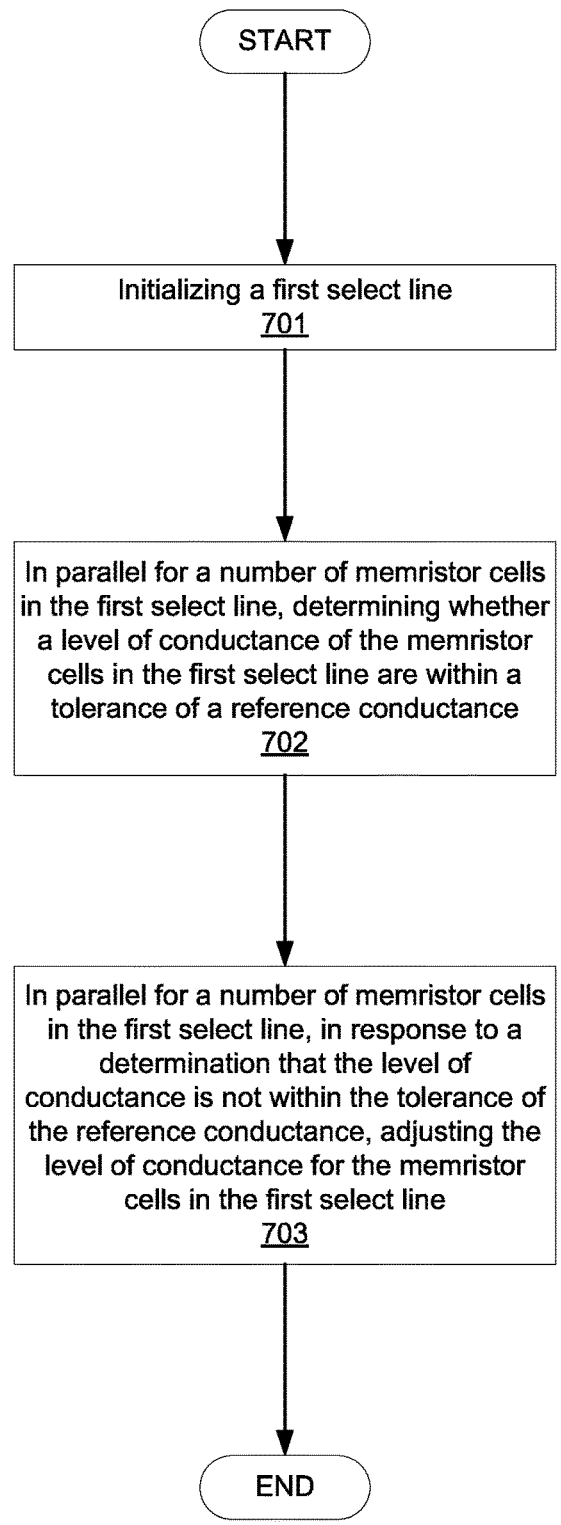
FIG. 7 is a flowchart showing a method of operating a plurality of memristive cells coupled as a memristor array, according to one example of the principles described herein.

FIG. 7 is a flowchart showing a method of operating a plurality of memristive cells (203) coupled as a memristor array (200), according to one example of the principles described herein. The method of FIG. 7 may begin by initializing (block 701) a first select line (205). In parallel for a number of memristor cells (203) in the first select line (205), it may be determined (block 702) whether a level of conductance of the memristor cells (203) in the first select line (205) are within a tolerance of a reference conductance, and in response to a determination that the level of conductance is not within the tolerance of the reference conductance, adjusting (block 703) the level of conductance for the number of memristive cells (203) in the first select line. More details regarding this method will now be provided in connection with FIG. 8.

Figure 8:
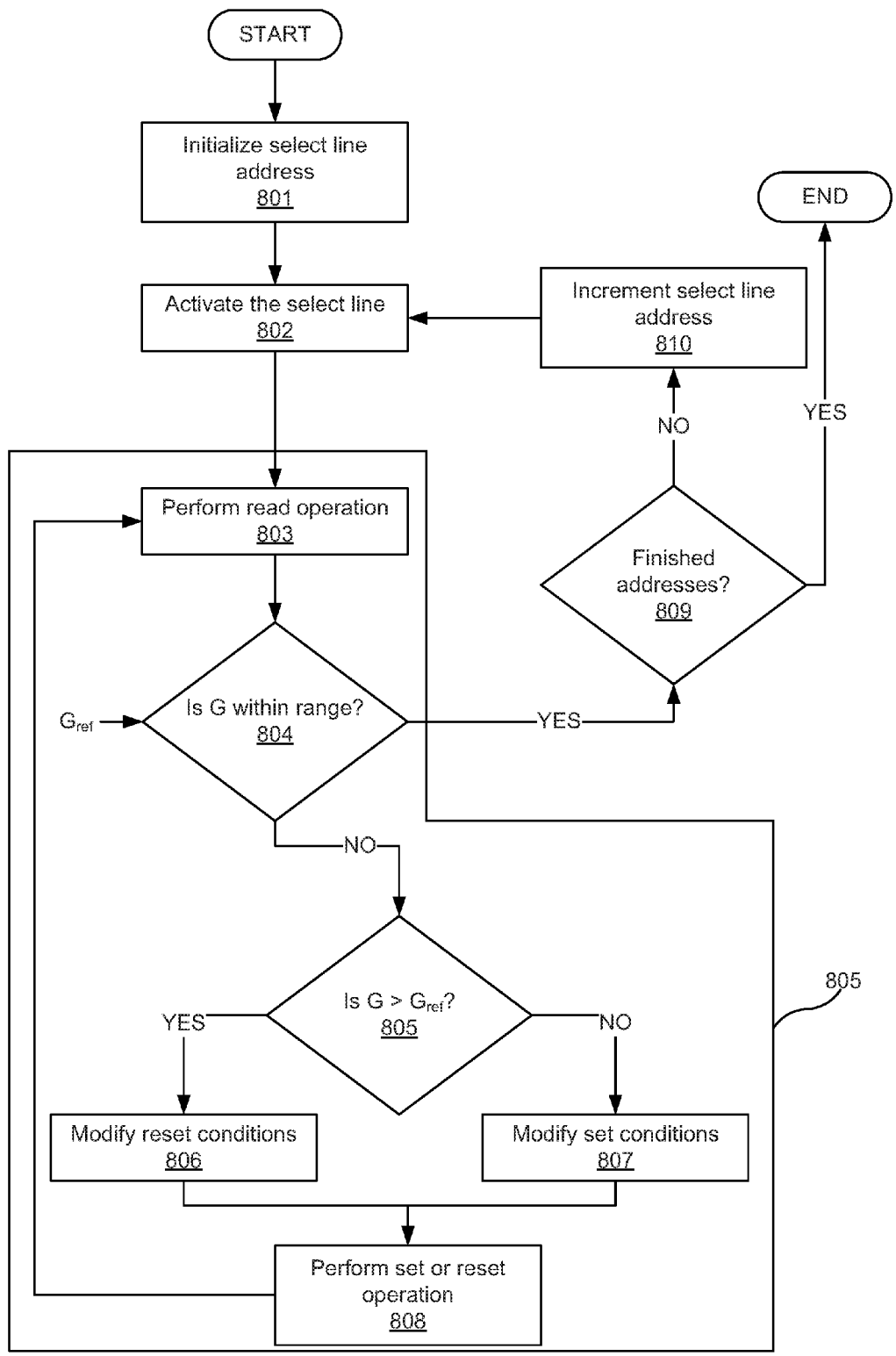
FIG. 8 is a flowchart showing a method of operating a plurality of memristive cells coupled as a memristor array, according to another example of the principles described herein.

FIG. 8 is a flowchart showing a method of operating a plurality of memristive cells (203) coupled as a memristor array (200), according to another example of the principles described herein. The method of FIG. 8 may begin by initialing (block 801) a select line address. At block 801, the processor (101) of the computing device (100), or another processing device such as a microcontroller, an FPGA may be used to initialize a first select line address. The processor (101) may execute the memristor array programming module (111) to initialize (block 801) the select line address. At block 801, initialization may include giving each of the select lines coupled to the select line drivers (205-1, 205-2, 205-3, 205-4, 205-5) a number 1 through n for n number of row lines (201). Initialization includes addressing the first select line. Although the top select line is designated as the first select line herein, any of the row lines (201) may be designated as such. Further, the row lines (201) may be initialized in any order. However, from a practical standpoint, the simplest order would be to initialize the top row line (201) first and work in order down the memristor array (200).

At block 802, the first select line is activated or turned on. Activating (block 802) the first select line provides access to the memristive cells (203) located along the diagonal lines (220, 221) to which the first select line is coupled. In the example of FIG. 2, the first select line is the select line coupled to select line driver (205-1), and the diagonal line to which the first select line is coupled is diagonal line (220-1).

At block 803, a read operation is performed. The read operation is performed (block 803) by activating the electrode sensors (210-2, 210-4, 210-6, 210-8, 210-10) of the column decoder (210), the electrode sensors (211-2, 211-4, 211-6, 211-8, 211-10) of the row decoder (211), or combinations thereof to detect a level of conductance of the memristive cells (203) located along the diagonal lines (220, 221) to which the first select line is coupled. Again, the conductance level is a value inverse to the resistivity level of the memristive cells (203), and working in conductance values rather than resistance values is more intuitive when it comes to calculating, for example, dot products or other such computations. With reference to the example of FIG. 2, the read operation of block 803 will result in obtaining five conductance level values; one conductance level value for each of the memristive cells (203) located along the diagonal lines (220, 221) to which the first select line is coupled. The acquisition of these values may be performed in parallel since the electrode sensors (210-2, 210-4, 210-6, 210-8, 210-10, 211-2, 211-4, 211-6, 211-8, 211-10) are able to obtain these values independent of one another, and at the same time.

A comparison of each of the conductance values obtained for each of the memristive cells (203) located along the diagonal lines (220, 221) to which the first select line is coupled, with a reference conductance ($G_{ref}$) is performed at block 804. $G_{ref}$ represents a desired level of conductance that the memristive cells (203) are to be programmed to have. $G_{ref}$ includes, in the example of FIG. 2, five separate conductance values that a respective one of the five memristive cells (203) should be programmed to have. These five separate conductance values of $G_{ref}$ form a vector that may be applied to the corresponding five memristive cells (203). The conductance reading is performed simultaneously at one clock cycle of the processor (101), during which the measured conductance at each selected memristive cell (203) is obtained where the conductance (G)=[G1, G2, . . . Gn], where n is the number of selected memristive cells (203). These values are then compared to a vector of the desired reference values of conductance ($G_{ref}$) that equals [$G1_{ref}$, $G2_{ref}$ . . . $G_{nref}$] that correspond to the memristive cells (203) at each position in 'G'. As will be described in more detail below, if all values in G are in range of the corresponding indexed values in $G_{ref}$, the memristive cells (203) are said to be programmed or trained, and the method proceeds to the next select line address.

Thus, at block 804, it is determined whether the conductance values obtained for each of the memristive cells (203) is within range of $G_{ref}$. In one example, the range defines a tolerance level past which if any of the conductance values obtained for each of the memristive cells (203) are within, the determination as to block 804 is NO. In one example, the range may be defined by a user, administrator, the processor (101) of the computing device (100), or a combination thereof, and may be based on, for example, an adaptive parameter, intelligence within the system, the application of the memristor array (200), other parameters, or combinations thereof.

If it is determined that the conductance values obtained for each of the memristive cells (203) are not in range of $G_{ref}$ (block 804, determination NO), then the method proceeds to block 805 where it is determined if the conductance values obtained for each of the memristive cells (203) are greater than $G_{ref}$. If the conductance values obtained for each of the memristive cells (203) are greater than $G_{ref}$, then the reset conditions for the memristors (203) located along the diagonal lines (220, 221) to which the first select line is coupled are modified (block 806). Modification (block 806) of the reset conditions includes moving the conductance level of the memristive cells (203) to a relatively lower value because the detected conductance levels of the memristive cells (203) is higher than $G_{ref}$, is outside the range or tolerance, or combinations thereof. If, instead, the conductance values obtained for each of the memristive cells (203) are not greater than $G_{ref}$, (i.e., are less than $G_{ref}$), then the set conditions for the memristors (203) located along the diagonal lines (220, 221) to which the first select line is coupled are modified (block 807). Modification (block 807) of the set conditions includes moving the conductance level of the memristive cells (203) to a relatively higher value because the detected conductance levels of the memristive cells (203) are lower than $G_{ref}$, is outside the range or tolerance, or combinations thereof. Modifying the set and reset conditions includes modifying the voltage amplitude, modifying the pulse duration, or modifying the number of consecutive pulses.

A set or reset operation is performed (block 808) based on the modified set conditions or modified reset conditions obtained at either block 807 or 806, respectively. In one example, a set of the memristors (203) located along the diagonal lines (220, 221) to which the first select line is coupled is performed by applying a voltage to the memristive cells (203) via the column lines (202), and a reset of the memristors is performed by applying a voltage to the memristive cells (203) via the row lines (201). In another example, the set is performed by applying a voltage to the memristive cells (203) via the row lines (201) and the reset is performed by applying a voltage to the memristive cells (203) via the column lines (202). Thus, the set and reset use the opposite of the row lines (201) and the column lines (202) for their respective processes.

The process loops back to block 803 to perform a subsequent read operation with respect to the memristors (203) located along the diagonal lines (220, 221) to which the first select line is coupled. The determination at block 804 is performed again. Thus, the processes of blocks 803 through 808 are performed a number of iterations until the conductance values obtained or adjusted for each of the memristive cells (203) are within the range (block 804, determination YES).

Here it is noted that the process within box 850, including blocks 803 through 808 are performed in parallel with respect to all the memristive cells (203) located along the diagonal lines (220, 221) to which the particular select line is coupled. This vastly decreases the time it takes to program the memristor array (200) since multiple memristive cells (203) are being addressed simultaneously. This parallel processing causes the number of programming operations to be reduced from $n^2$ to n for square memristor arrays (200) and from m*n to n reduction for m by n arrays where m is greater than n (i.e., m>n). This reduction in programming time decreases the latency of programming and increases the application space of memristor-based accelerators.

In another example, blocks 803 through 808 may be serialized in some situations where the memristor array (200) includes certain sizes or certain sizes of portions of the memristor array (200). Reference may be made to FIGS. 6B and 6D wherein portions of the memristor array (200) are logically divided. In this example, the second halves of the arrays (200) may be analyzed serially with respect to the first halves.

Turning again to FIG. 8, the processes of blocks 803 through 808 are performed a number of iterations until the conductance values obtained or adjusted for each of the memristive cells (203) are within the range (block 804, determination YES). The method may continue by determining (block 809) if the addresses have been finished, or, in other words, if the last of the select lines has been addressed. If the last of the select lines has been addressed (block 809, determination YES), then the process terminates with a completely programmed memristor array (200).

If, however, the last of the select lines has not been addressed (block 809, determination NO), then the method continues by incrementing (block 810) the select line address. In this example, the second select line associated with the second select line driver (205-2) is activated at block 802, and the process repeats until all select line have been addressed and the memristor array (200) has been completely programmed.

In one example of the methods and systems described herein, the method may begin with different starting conditions of the feedback parameters that are based on, for example, the current values, dynamic feedback that takes the outputs of the memristor array (200) as input in order to modify the conductance, or other sources and types of feedback.

Figure 9:
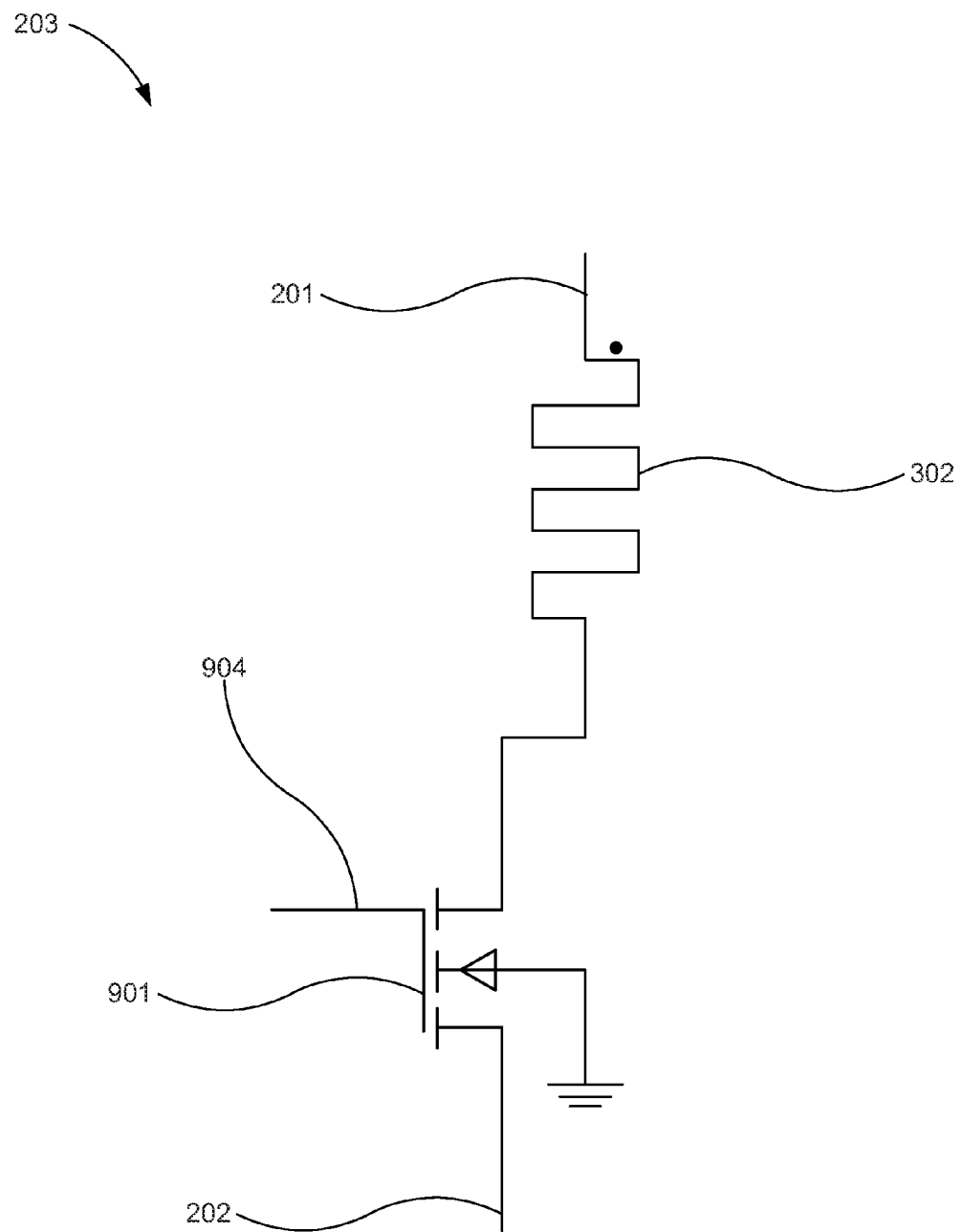
FIG. 9 is a circuit diagram of the memristive cells within the memristor array of FIG. 2, according to another example of the principles described herein.

FIG. 9 is a circuit diagram of the cells within the memristor array of FIG. 2, according to another example of the principles described herein. Throughout this description, the examples of memristor arrays (200) have been presented in the context of using the memristive arrays (200) as either a memory device or as an accelerator. The circuit diagram of FIG. 3 is a circuit used within an accelerator-type memristive array (200). The circuit diagram of FIG. 9, however, is a circuit used within a memory-type memristive array (200). The circuit of FIG. 9 includes a gate line (904) coupled to a transistor (901). The row line (201) is coupled to the resistor (302). Further, the memristor cell (203) is coupled to a row line (201) and a column line (202) at the ends. The circuit of FIG. 9 may be used as a memory device within the memristor array (200). In this example, and referring to FIG. 2, the electrically conductive diagonal lines (220-1, 220-2, 220-3, 220-4, 220-5, 220-6, 220-7, 221-1, 221-2, 221-3, 221-4) are used to program, for example 1's and 0's in the form of high and low conductance levels within the memristive cells (203). Further, when a particular select line driver (205-1, 205-2, 205-3, 205-4, 205-5) is addressed, each of the memristive cells (203) located along the diagonal lines (220, 221) to which the select line is coupled may be individually read or written (i.e., programmed) as instructed by the processor (101). Being able to simultaneously read and write memristive cells (203) within the memristor array (200) greatly increases the flexibility and utility of the memristor array (200). For example, if a user wishes to read a specific byte that is programmed into the memristive array (200), as well as write a byte to the array (200), the use may do so in parallel. Further, in an example where the memristor array (200) is used as an accelerator, the whole memristor array (200) may be subjected to the programming process described above in connection with FIG. 8. However, in an example where the memristor array (200) is used as a memory device, the whole memristor array (200) is not subjected to the programming process described above in connection with FIG. 8, but those portions that are to be written are programmed according to the method of FIG. 8.

Further, in one example, the memristor array (200), when used as a memory device, allows the reading signals of the selected cells to be used as feedback during writing in order to perform individualized write termination and pulse shaping. Still further, in one example, the architecture of FIG. 2, when used as a memory device, allows each electrode driver (210-1, 210-3, 210-5, 210-7, 210-9211-1, 211-3, 211-5, 211-7, 211-9) in a row line (201) or a column Line (202) to be single sized since it is connected to one cell at a time.

Figure 10:
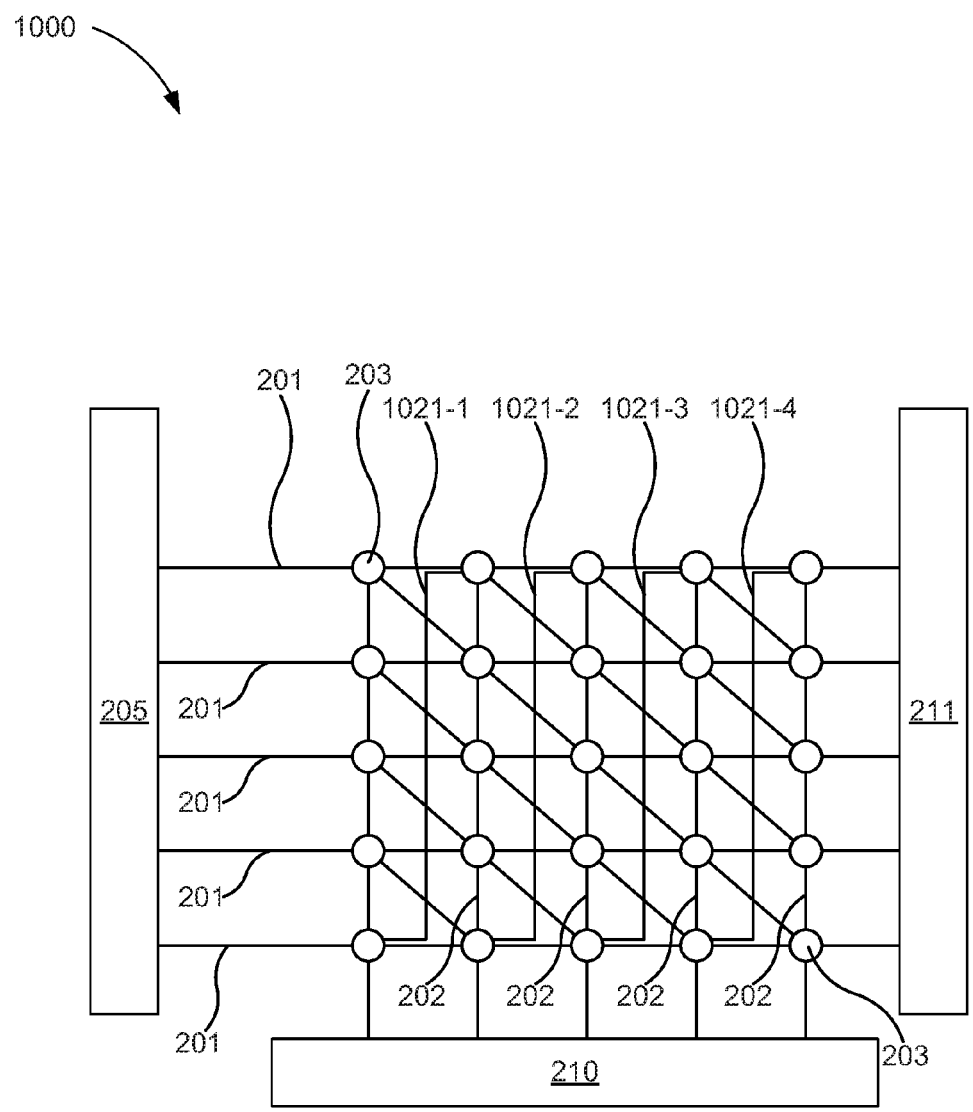
FIG. 10 is an array diagram of the memristor array used within the computing system of FIG. 1, according to another example of the principles described herein.

FIG. 10 is an array diagram of the memristor array (1100) used within the computing system (100) of FIG. 1, according to another example of the principles described herein. The memristive array (1100) includes the elements described above in connection with FIG. 2. However, instead of diagonal lines (221), the lines coupling those memristive cells (203) that are coupled by the diagonal lines (221) include a number of square-shaped form factor connection lines (1021-1, 1021-2, 1021-3, 1021-4) that may be referred to as Manhattan routings. The example of FIG. 10 is provided to demonstrate that the shape of the lines coupling the memristive cells (203) within the memristor array (200) may include different architectures and shapes to accomplish the objectives described herein.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (101) of the computing system (100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a method of operating a plurality of memristive cells coupled as a memristor array and associated memristor arrays. The method includes initializing a first select line, and, in parallel for a number of memristor cells in the first select line, determining whether a level of conductance of the memristor cells in the first select line are within a tolerance of a reference conductance, and, in response to a determination that the level of conductance is not within the tolerance of the reference conductance, adjusting the level of conductance for the memristor cells in the first select line. In response to a determination that the level of conductance is within a tolerance of a reference conductance, the method includes initializing a second select line, and, in parallel for a number of memristor cells in the second select line, determining whether a level of conductance of the memristor cells in the second select line are within a tolerance of a reference conductance, and in response to a determination that the level of conductance is not within a tolerance of a reference conductance, adjusting the level of conductance for the memristor cells in the second select line.

The present methods and systems allow for parallel programming of memristive cells in a memristor array and reading of the memristive cells. For example, the memristive array may be used to program a number of memristive cells while simultaneously being able to compute, for example, a dot product of the values contained in the memristive cells.

The preceding description has been presented to illustrate and describe examples of the principles described. This description is not intended to be exhaustive or to limit these principles to any precise form disclosed. Many modifications and variations are possible in light of the above teaching.

What is claimed is:

1. A method of operating a plurality of memristive cells coupled as a memristor array comprising:
   initializing a first select line; and
   in parallel for a number of memristor cells in the first select line:
   determining whether a level of conductance of the memristor cells in the first select line are within a tolerance of a reference conductance; and
   in response to a determination that the level of conductance is not within the tolerance of the reference conductance, adjusting the level of conductance for the memristor cells in the first select line.

2. The method of claim 1, comprising in response to a determination that the level of conductance is within a tolerance of a reference conductance:
   initializing a second select line; and
   in parallel for a number of memristor cells in the second select line:
   determining whether a level of conductance of the memristor cells in the second select line are within a tolerance of a reference conductance; and
   in response to a determination that the level of conductance is not within a tolerance of a reference conductance, adjusting the level of conductance for the memristor cells in the second select line.

3. The method of claim 1, comprising:
   determining whether a final select line within the memristor array has been initialized; and
   in response to a determination that the final select line within the memristor array has not been initialized, incrementing initialization of select lines to a subsequent select line.

4. The method of claim 1, wherein determining whether the level of conductance of the memristor cells in the first select line are within the tolerance of the reference conductance, and in response to a determination that the level of conductance is not within a tolerance of the reference conductance, adjusting the level of conductance for the memristor cells in the first select line comprises:
   performing a read function on the memristor cells in the first select line;
   sensing the conductance level of the memristor cells in the first select line;
   comparing the conductance level of the memristor cells in the first select line with a reference conductance;
   determining if the conductance level of the memristor cells in the first select line are greater than the reference conductance;
   in response to a determination that the conductance level of the memristor cells in the first select line are greater than the reference conductance, modifying the reset conditions and performing a reset operation; and
   in response to a determination that the conductance level of the memristor cells in the first select line are less than the reference conductance, modifying the set conditions and performing a set operation.

5. The method of claim 4, wherein modifying the set and reset conditions comprises modifying the voltage amplitude, modifying the pulse duration, or modifying the number of consecutive pulses.

6. The method of claim 1, comprising:
determining the dimensions of the memristor array;
if the dimension of the memristor array is n by n memristive cells, adjusting the level of conductance for the memristor cells within the memristor array; and
if the dimension of the memristor array is m by n memristive cells, determining if m is an integer of n;
if m is an integer of n, analyzing in series the m by n memristor array as a number of parsed n by n arrays where the number of parsed n by n arrays is equal to the quotient of m and n; and
if m is not an integer of n:
analyzing in series the m by n memristor array as a number of parsed n by n arrays where the number of parsed n by n arrays is equal to the quotient of m and n;
modifying the architecture of the remainder m by n memristor array, and
analyzing in series with the parsed n by n arrays, the remainder m by n memristor array.

7. The method of claim 1, wherein:
the reference conductance comprises a plurality of reference conductance values, each of the plurality of reference conductance value being assigned to one of the memristor cells; and
determining whether a level of conductance of the memristor cells in the first select line are within a tolerance of a reference conductance comprises, for each of the memristor cells:
determining whether a level of conductance of the memristor cell is within a tolerance of its assigned reference conductance value.

8. A memristor array comprising:
a number of row lines;
a number of column lines intersecting the row lines to form a number of junctions;
a number of memristive cells coupled between the row lines and the column lines at the junctions;
a number of first diagonal lines coupled between the memristive cells in a first direction; and
a number of second diagonal lines coupled between the memristive cells in a second direction,
wherein the first diagonal lines and the second diagonal lines each couple at least two memristive cells via diagonally run interconnects with respect to the row lines and the column lines, and
wherein the memristive cells are trained via application of a voltage via the first and second diagonal lines.

9. The memristor array of claim 8, further comprising a number of select line drivers to select a row of the memristor array, wherein selection of a first select line driver during a programming process causes a programming voltage to be directed via the first and second diagonal lines coupled to the first select line driver.

10. The memristor array of claim 9, comprising:
a column decoder comprising:
a first set of a number of electrode driver and electrode sensor pairs; and
a first set of switches for each electrode driver and electrode sensor pair of the first set of electrode driver and electrode sensor pairs to switch between the electrode drivers and the electrode sensors of the first set of electrode driver and electrode sensor pairs; and
a row decoder comprising:
a second set of a number of electrode driver and electrode sensor pairs; and
a second set of switches for each electrode driver and electrode sensor pair of the second set of electrode driver and electrode sensor pairs to switch between the electrode drivers and the electrode sensors of the second set of electrode driver and electrode sensor pairs;
wherein the electrode drivers of the first and second sets of the electrode driver and electrode sensor pairs drive a voltage to write to a number of the memristive cells, and
wherein the electrode sensors of the first and second sets of the electrode driver and electrode sensor pairs sense a current from a number of the memristive cells.

11. The memristor array of claim 10, wherein selection between the electrode drivers and the electrode sensors of the first and second sets of electrode driver and electrode sensor pairs are performed in parallel to allow for each memristor cell in a first select line to be simultaneously either programmed or read.

12. The memristor array of claim 8, wherein the memristor cells are multi-level cells wherein the row lines, the column lines, the first diagonal lines, and the second diagonal lines are positioned on separate levels of the memristor cells.

13. The memristor array of claim 8, wherein the memristive cells comprise two transistors and one-resistor (2T1R).

14. The memristor array of claim 8, wherein the memristive cells comprise one transistor and one-resistor (1T1R).

15. The memristor array of claim 8, wherein the memristor array is a memristor memory array.

16. The memristor array of claim 8, wherein the memristor array is a memristive accelerator array.

17. A method of operating a memristor array, comprising:
performing a read function on a plurality of memristor cells on a select line;
sensing a conductance level of the plurality of memristor cells on the select line;
determining whether the conductance level of the plurality of memristor cells on the select line are greater than a reference conductance by comparing the conductance level of the plurality of memristor cells on first select line to the reference conductance;
in response to a determination that the conductance level of the plurality of memristor cells on the select line are greater than the reference conductance, modifying reset conditions of the plurality of memristor cells and performing a reset operation; and
in response to a determination that the conductance level of the plurality of memristor cells on the select line are less than the reference conductance, modifying set conditions of the plurality of memristor cells and performing a set operation.

18. The method of claim 17, wherein:
the reference conductance comprises a plurality of reference conductance values, each of the plurality of reference conductance value being assigned to one of the plurality of memristor cells; and determining whether the conductance level of the plurality of memristor cells on the select line are greater than a reference conductance comprises, for each of the memristor cells:
 comparing the conductance level of the memristor cell to its assigned reference conductance value.

19. The method of claim 17, wherein the plurality of memristor cells are located along a diagonal line to which the first select line is coupled.

20. The method of claim 17, wherein each of the plurality of memristor cells are on different row line and column line pairs.

* * * * *